(12) United States Patent
Takizawa

(10) Patent No.: US 9,037,441 B2
(45) Date of Patent: May 19, 2015

(54) MACRO MODEL OF OPERATIONAL AMPLIFIER AND CIRCUIT DESIGN SIMULATOR USING THE SAME

(75) Inventor: Noboru Takizawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 409 days.

(21) Appl. No.: 13/432,444

(22) Filed: Mar. 28, 2012

(65) Prior Publication Data

US 2012/0253776 A1    Oct. 4, 2012

(30) Foreign Application Priority Data

Mar. 29, 2011   (JP) .................. 2011-071503
Mar. 29, 2011   (JP) .................. 2011-071504
Feb. 20, 2012   (JP) .................. 2012-033677

(51) Int. Cl.
     *G06F 17/50*      (2006.01)
     *H03F 1/34*      (2006.01)

(52) U.S. Cl.
     CPC .............. *G06F 17/5036* (2013.01); *H03F 1/34* (2013.01)

(58) Field of Classification Search
None
See application file for complete search history.

(56) References Cited

U.S. PATENT DOCUMENTS

| | | | | |
|---|---|---|---|---|
| 5,394,346 A | * | 2/1995 | Milsom | 703/14 |
| 5,617,326 A | * | 4/1997 | Yamamoto | 703/14 |
| 7,334,199 B1 | * | 2/2008 | Russell, Jr. | 716/51 |

FOREIGN PATENT DOCUMENTS

| | | |
|---|---|---|
| JP | 05-225282 | 9/1993 |
| JP | 2010-272020 | 12/2010 |

OTHER PUBLICATIONS

Baker, Bonnie "Operational Amplifier Macromodels: A Comparison" (1993) available at <http://www.ti.com/lit/an/sboa027/sboa027.pdf>.*
Zwolinski, M., et al. "Analogue Fault Modeling and Simulation for Supply Current Monitoring" IEEE Proceedings of the 1996 European Design & Test Conference, pp. 547-552 (1996).*
Wilson, Peter R., et al. "Behavioural Modelling of Operational Amplifier Faults using VHDL-AMS" IEEE Proceedings of the 2002 Design, Automation & Test in Europe Conference (2002).*
Pan, Chen-Yang & Cheng, Kwang-Ting (Tim) "Fault Macromodeling for Analog/Mixed-Signal Circuits" IEEE International Test Conference, paper 36.2, pp. 913 (1997).*
Kilic, Y. & Zwolinski, M. "Behavioural Fault Modeling and Simulation Using VHDL-AMS to Speed-Up Analog Fault Simulation" Analog Integrated Circuits & Signal Processing, vol. 39, pp. 177-190 (2004).*

(Continued)

*Primary Examiner* — Kamini S Shah
*Assistant Examiner* — Jay B Hann
(74) *Attorney, Agent, or Firm* — Fish & Richardson P.C.

(57) ABSTRACT

The present invention aims to simulate a response more similar to a actual machine while inhibiting load increase in analog operation. Program configuration of the present invention is a component of a simulation program for circuit design, which is executed by a computer. The computer includes an operation portion, a storage portion, a manipulation portion, and a display portion, so that the computer exerts a function of a circuit design simulator, and as a macro model of an operational amplifier for use in the circuit design simulator, enabling the computer to act by simulating a response of the operational amplifier on the circuit design simulator. The macro model of the operational amplifier includes a control portion (LMT1) for generating output exception in the event of input exception or power supply exception of the operational amplifier.

16 Claims, 15 Drawing Sheets

(56) References Cited

OTHER PUBLICATIONS

Kendall, Ray "User-Friendly Model Simplifies Op-Amp Simulation" EDN Network, pp. 63-68 (2007) available at <http://www.aboutspice.com/documents/pdf/edn-6402894.pdf>.*

Microsim "MicroSim PSpice & Basics Circuit Analysis Software: User's Guide" (1997).*

Nixon, Janet & Scott, Jonathan "Macromodel of a Current-Feedback Amplifier" IEEE Int'l Symp. on Circuits & Systems, vol. 4, pp. 3213-3216 (1990) available from <http://ieeexplore.ieee.org/xpls/abs_all.jsp?arnumber=112695>.*

Bowers, D.F., et al. "A Comprehensive Simulation Macromodel for 'Current Feedback' Operational Amplifiers" IEEE Proceedings, vol. 137, pt. G, No. 2 (1990).*

* cited by examiner

MACRO MODEL OF OPERATIONAL AMPLIFIER AND CIRCUIT DESIGN SIMULATOR USING THE SAME

BACKGROUND OF THE INVENTION

1. Field of the Invention

The present invention relates to a macro model of an operational amplifier for use in a circuit design simulator.

2. Description of the Related Art

In the prior art, simulation programs for circuit design, for example, SPICE (Simulation Program with Integrated Circuit Emphasis) based simulation programs for circuit design, are widely used as a supporting tool for design of an semiconductor Integrated Circuit (IC). Such a simulation program for circuit design is software enabling a computer executing the program to exert a function of a circuit design simulator. A circuit design simulator employs a passive element model such as a resistor or a capacitor, an active element model such as a transistor or a diode, a macro model such as an operational amplifier, a voltage source, a current source, and wiring suitably combined and fabricated into an analog circuit to simulate a response.

Patent Document 1 and Patent Document 2 are examples of the prior art.

PRIOR ART DOCUMENT

Patent Document

[Patent Document 1] Japanese Patent Application Publication No. 1993-225282
[Patent Document 2] Japanese Patent Application Publication No. 2010-272020

SUMMARY OF THE INVENTION

An actual operational amplifier generally can fail to perform correctly unless an input signal or a power supply voltage is confined to a specific normal range. However, a conventional macro model of an operational amplifier employs circuit elements with ideal properties (ideal elements, ideal power supply, and ideal ground) to preferentially minimize load in analog operation, so that the conventional macro model of operational amplifier can perform without problem even if the input falls outside of a normal range of the input signal or the power supply voltage. Therefore, there is a problem that simulation verification performed on an analog circuit by using the conventional macro model of the operational amplifier may fail to detect potential input exceptions (such as design error in a preceding circuit) or power supply exceptions (such as design error in wiring of a power supply system) of the actual operational amplifier.

Moreover, in the conventional macro model of the operational amplifier, an output current is generated from an ideal ground and flows to an output terminal of the operational amplifier, and a driving current flowing into the operational amplifier located between a power supply terminal and a ground terminal is set to be a constant value which is independent of the output current. Therefore, the conventional macro model of the operational amplifier has the problem that simulation verification cannot be performed on drop of the power supply voltage or rise of the ground voltage caused by resistance of substrate wiring.

As such, the conventional macro model of the operational amplifier exhibits a behavior different from that of the actual operational amplifier, which creates a problem in that even an analog circuit that is determined to have no problem in simulation verification can have obvious problems in the actual trial fabrication stage.

In view of the problems found by the inventors of the application, the objective of the present invention is to provide a macro model of an operational amplifier which can simulate a response more similar to a actual machine while inhibiting load increase in analog operation, and a circuit design simulator using the same.

In order to achieve the objective, a program of the present invention has a configuration (Configuration 1), which is a component of a simulation program for circuit design and executed by a computer, the computer including an operation portion, a storage portion, a manipulation portion, and a display portion so that the computer functions as a circuit design simulator, and as a macro model of an operational amplifier for use in the circuit design simulator, enabling the computer to act by simulating a response of the operational amplifier on the circuit design simulator, where the macro model of the operational amplifier includes a control portion for generating an output exception in the event of input exception or power supply exception of the operational amplifier.

Furthermore, the program according to Configuration 1 can have a configuration (Configuration 2) in which the control portion limits a voltage between two terminals of a current source for generating a driving current of an input section in a specific range.

Moreover, the program according to Configuration 2 can have a configuration (Configuration 3) in which an upper limit is set to be a function of a power supply voltage and an ambient temperature.

Moreover, the program according to Configuration 1 can have a configuration (Configuration 4) in which the control portion monitors an input signal and the power supply voltage if an exception determination is found, and controls at least one of the input section, an amplification section, and an output section of the operational amplifier and generates an output exception in the event of input exception or power supply exception of the operational amplifier.

Moreover, the program according to Configuration 4 can have a configuration (Configuration 5) in which the control portion further monitors the ambient temperature if an exception determination is found.

Moreover, the program according to Configuration 4 can have a configuration (Configuration 6) in which the macro model of the operational amplifier further includes: a driving current generation portion, located between a power supply terminal and a ground terminal, for generating the driving current of the operational amplifier; an output current generation portion, located between an output terminal and an ideal ground, for generating an output current of the operational amplifier; an output current detection portion, for detecting a magnitude and a direction of the output current; and a feedback current generation portion, located between the power supply terminal and the ideal ground or between the ideal ground and the ground terminal, for generating a feedback current corresponding to the output current.

Moreover, a program of the present invention has a configuration (Configuration 7), which is a component of a simulation program for circuit design, executed by a computer, the computer including an operation portion, a storage portion, a manipulation portion, and a display portion so that the computer exerts a function of a circuit design simulator, and as a macro model of an operational amplifier for use in the circuit design simulator, enabling the computer to act by simulating an action of the operational amplifier on the circuit design simulator, in which the macro model of the operational amplifier includes: a driving current generation portion, located between a power supply terminal and a ground terminal, for generating a driving current of the operational amplifier; an output current generation portion, located between an output terminal and an ideal ground, for generating an output current of the operational amplifier; an output current detection portion, for detecting a magnitude and a direction of the output current; and a feedback current generation portion, located between the power supply terminal and the ideal ground or between the ideal ground and the ground terminal, for generating a feedback current corresponding to the output current.

Moreover, the program according to Configuration 6 or 7 can have a configuration (Configuration 8) in which the feedback current generation portion generates a feedback current flowing from the power supply terminal to the ideal ground when the output current flows from the ideal ground to the output terminal, and generates a feedback current flowing from the ideal ground to the ground terminal when the output current flows from the output terminal to the ideal ground.

Moreover, a simulation program for circuit design has a configuration (Configuration 9) which is executed by a computer including an operation portion, a storage portion, a manipulation portion, and a display portion so that the computer functions as a circuit design simulator, and the simulation program for circuit design includes a main program; and a model library referenced by the main program, where the model library includes the program according to any one of Configurations 1 to 8 as a macro model of a operational amplifier for use in the circuit design simulator.

Moreover, the simulation program for circuit design according to Configuration 9 can have a configuration (Configuration 10) in which the main program includes a circuit fabrication module, enabling the operation portion and the display portion to function, so as to fabricate a circuit on the circuit design simulator according to an input from the manipulation portion; a component reference module, enabling the operation portion and the display portion to function, so as to refer to the model library according to an input from the manipulation portion; a probe disposition module, enabling the operation portion and the display portion to function, so as to dispose a probe on the circuit according to an input from the manipulation portion; a waveform plotting module, enabling the operation portion and the display portion to function, so as to plot a waveform of a node disposed with the probe according to an input from the manipulation portion; and a waveform analysis module, enabling the operation portion and the display portion to function, so as to analyze the waveform according to an input from the manipulation portion.

Moreover, a circuit design simulator of the present invention has a configuration (Configuration 11) implemented by executing the simulation program for circuit design according to Configuration 10 by a computer.

Moreover, a simulation method for circuit design of the present invention has a configuration (Configuration 12) in which a macro model of an operational amplifier having a control portion for generating an output exception in the event of input exception or power supply exception is used.

Moreover, the simulation method for circuit design according to Configuration 12 can have a configuration (Configuration 13) in which the control portion limits a voltage between two terminals of a current source for generating a driving current of an input section in a specific range.

Moreover, the simulation method for circuit design according to Configuration 13 can have a configuration (Configuration 14) in which an upper limit is set to be a function of a power supply voltage and an ambient temperature.

Moreover, the simulation method for circuit design according to Configuration 14 can have a configuration (Configuration 15) in which the control portion monitors an input signal and the power supply voltage if an exception determination is found, and controls at least one of the input section, an amplification section, and an output section of the operational amplifier and generates an output exception in the event of input exception or power supply exception of the operational amplifier.

Moreover, the simulation method for circuit design according to Configuration 15 can have a configuration (Configuration 16) in which the control portion further monitors the ambient temperature if an exception determination is found.

Moreover, the simulation method for circuit design according to any one of Configurations 12 to 16 can have a configuration (Configuration 17) in which the macro model of the operation amplifier further includes a driving current generation portion, located between a power supply terminal and a ground terminal, for generating the driving current of the operational amplifier; an output current generation portion, located between an output terminal and an ideal ground, for generating an output current of the operational amplifier; an output current detection portion, for detecting a magnitude and a direction of the output current; and a feedback current generation portion, located between the power supply terminal and the ideal ground or between the ideal ground and the ground terminal, for generating a feedback current corresponding to the output current.

Moreover, a simulation method for circuit design of the present invention has a configuration (Configuration 18) in which a macro model of an operational amplifier is used and the macro model of the operational amplifier includes: a driving current generation portion, located between a power supply terminal and a ground terminal, for generating a driving current of the operational amplifier; an output current generation portion, located between an output terminal and an ideal ground, for generating an output current of the operational amplifier; an output current detection portion, for detecting a magnitude and a direction of the output current; and a feedback current generation portion, located between the power supply terminal and the ideal ground or between the ideal ground and the ground terminal, for generating a feedback current corresponding to the output current.

Moreover, the simulation method for circuit design according to Configuration 17 or 18 can have a configuration (Configuration 19) in which the feedback current generation portion generates a feedback current flowing from the power supply terminal to the ideal ground when the output current flows from the ideal ground to the output terminal, and generates a feedback current flowing from the ideal ground to the ground terminal when the output current flows from the output terminal to the ideal ground.

Effect of Invention

According to the present invention, a macro model of an operational amplifier which can simulate a response more similar to a actual machine while inhibiting load increase in analog operation, and a circuit design simulator using the same are provided.

BRIEF DESCRIPTION OF THE DRAWINGS

The invention will be described according to the appended drawings in which.

PREFERRED EMBODIMENT OF THE PRESENT INVENTION

Circuit Design Simulator

Figure 1:
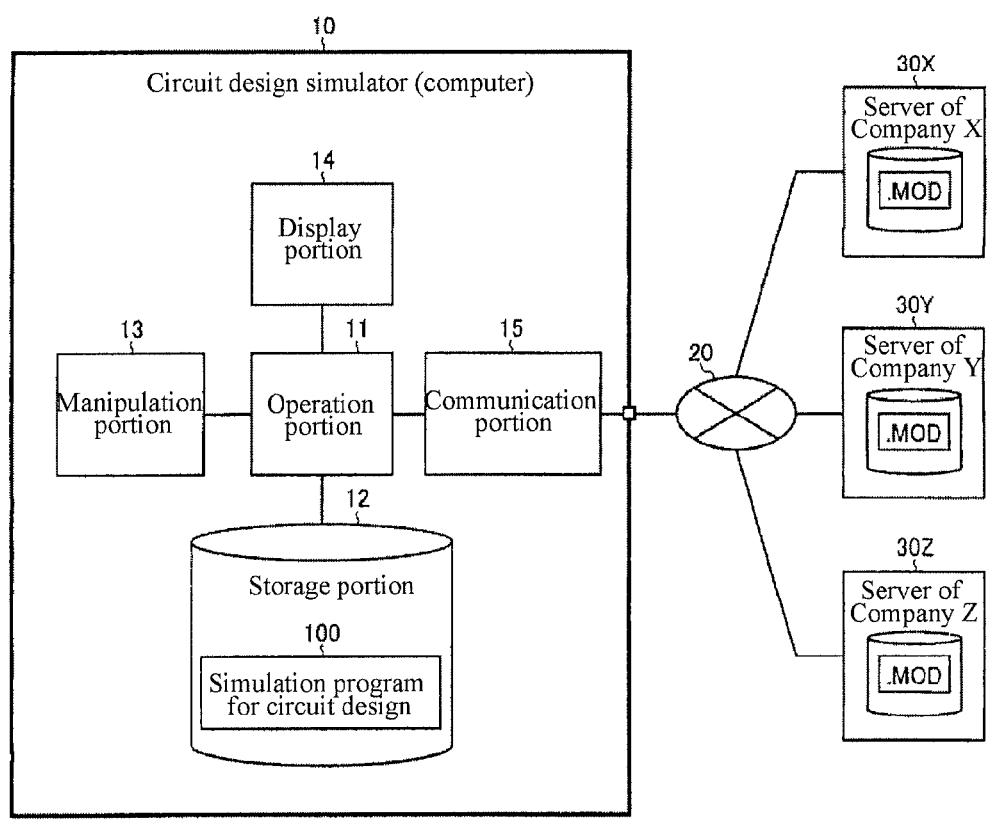
FIG. 1 is a block diagram of a configuration example of a circuit design simulator according to the present invention.

FIG. 1 is a block diagram of a configuration example of a circuit design simulator according to the present invention. A circuit design simulator 10 according to the configuration example is a computer including an operation portion 11, a storage portion 12, a manipulation portion 13, a display portion 14, and a communication portion 15, and is implemented by executing a simulation program 100 for circuit design stored in the storage portion 12 by the operation portion 11.

The operation portion 11 controls an action of the circuit design simulator 10 in general. For example, the operation portion 11 executes the simulation program 100 for circuit design stored in the storage portion 12, so as to perform not only various operation processing for enabling the computer to exert a function of the circuit design simulator 10, but also identification processing on user manipulation input from the manipulation portion 13, or display control on the display portion 14 by various frames. The operation portion 11 can be a Central Processing Unit (CPU).

The storage portion 12 is used not only as a storage region of an Operation System (OS) program and various software (including the simulation program 100 for circuit design), but also as a storage region of various data created by a user or a working region of various software. The storage portion 12 can be a hard disk drive, a Solid State Drive, or a Universal Serial Bus (USB) storage device.

The manipulation portion 13 receives various user manipulations (for example, circuit fabrication manipulation, component reference manipulation, and probe disposition manipulation), and transfers the user manipulations to the operation portion 11. The manipulation portion 13 can be, for example, a keyboard, a mouse, a trackball, a pen tablet, and a touch panel.

The display portion 14 displays various frames (for example, a circuit fabrication field, a component pallet, and a waveform plotting window) according to an instruction of the operation portion 11. The display portion 14 can be, for example, a liquid crystal display.

The communication portion 15 performs information communication via a telecommunications line 20 (Internet or Local Area Network (LAN)) according to an instruction of the operation portion 11. For example, the communication portion 15 performs information communication with servers 30X-30Z of various companies manufacturing and selling semiconductor devices via the telecommunications line 20, and downloads, for example, a macro model file (*.mod).

Simulation verification (for example, property evaluation and performance inspection) of an analog circuit can be performed by using the circuit design simulator 10 before the analog circuit is actually fabricated.

<Simulation Program for Circuit Design>

Figure 2:
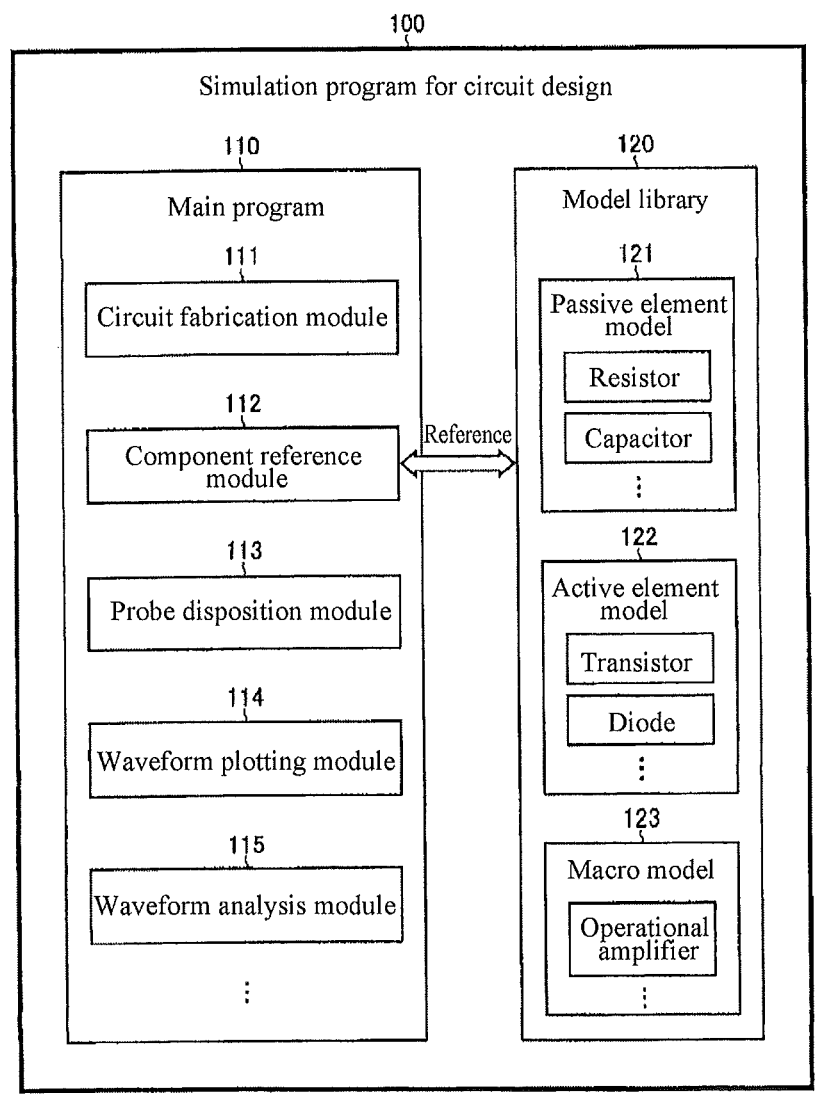
FIG. 2 is a block diagram of a configuration example of a simulation program for circuit design according to the present invention.

FIG. 2 is a block diagram of a configuration example of the simulation program 100 for circuit design. The simulation program 100 for circuit design (for example, a SPICE based simulation program for circuit design) is software executed by a computer so as to enable the computer to exert a function of the circuit design simulator 10 (see FIG. 1). The simulation program 100 for circuit design according to the configuration example includes a main program 110 and a model library 210. The simulation program 100 for circuit design is transferred and even released through a physical medium such as an optical disk (CD-ROM, DVD-ROM, and the like) or a semiconductor storage device (for example, a USB storage device), or a telecommunications line such as Internet.

The main program 110 is a core part enabling the computer to exert the function of the circuit design simulator 10, and is formed to be an integration of various module programs (for example, a circuit fabrication module 111, a component reference module 112, a probe disposition module 113, a waveform plotting module 114, and a waveform analysis module 115).

The circuit fabrication module 111 is an element program that enables the operation portion 11 and the display portion 14 to function in a way such that circuit fabrication is carried out on the circuit design simulator 10 according to an input from the manipulation portion 13. If a user configures component symbols (a resistor, a capacitor, a transistor, a diode, an operational amplifier, a voltage source, a current source and wiring) displayed on the display portion 14 in the circuit fabrication field by using the manipulation portion 13, the circuit fabrication module 111 performs text based encoding corresponding to the configuration content. Therefore, the user can intuitively fabricate any analog circuit without directly compiling text based codes.

The component reference module 112 is an element program which enables the operation portion 11, and the display portion 14 functions in a way such that the model library 120 is referenced according to an input from the manipulation portion 13. For example, if the user selects the symbol of the operational amplifier from the component pallet displayed in the display portion 14 by using the manipulation portion 13, the component reference module 112 references a macro model 123 of the operational amplifier included in the model library 120.

The probe disposition module 113 is an element program which enables the operation portion 11 and the display portion 14 to function in way such that a probe (a voltage or current measurement point) is disposed on a circuit diagram according to an input from the manipulation portion 13. For example, if the user clicks a specific node on the circuit diagram displayed on the display portion 14 by using the manipulation portion 13 using a mouse, the probe disposition module 113 disposes the probe on the clicked node.

The waveform plotting module 114 is an element program which enables the operation portion 11 and the display portion 14 to function, so as to plot a waveform of the node disposed with the probe according to an input from the manipulation portion 13. For example, if the user disposes a probe on an output terminal of the operational amplifier displayed in the display portion 14 by using the manipulation portion 13, the waveform plotting module 114 displays an output waveform (a dummy oscilloscope waveform) of the operational amplifier on a waveform plotting window.

The waveform analysis module 115 is an element program which enables the operation portion 11 and the display portion 14 to function, so as to analyze the waveform of the node disposed with the probe according to an input from the manipulation portion 13. Examples of waveform analysis implemented by the waveform analysis module 115 include transient analysis, direct current analysis, small-signal alternating current analysis, and noise analysis.

The model library 120 includes various models (for example, a passive element model 121, an active element model 122, and a macro model 123) for use in the circuit design simulator 10, and as a component of the simulation program 10 for circuit design, is referenced by the main program 110 (especially the component reference module 112). The passive element model 121 is a program which enables the computer to act, so as to simulate a response of a passive element (for example, the resistor and the capacitor) on the circuit design simulator 10. The active element model 122 is a program which enables the computer to act, so as to simulate a response of an active element (for example, the transistor or the diode) on the circuit design simulator 10. The macro model 123 of the operational amplifier is a program which enables the computer to act, so as to simulate a response of the operational amplifier on the circuit design simulator 10. Furthermore, the models 121-123 include a model capable of being freely downloaded from servers 30X-30Z of various companies manufacturing and selling semiconductor devices via the telecommunications line 20.

By using such a simulation program for circuit design, a general-purpose computer (for example, a personal computer or a work station) can be used as the circuit design simulator 10.

<Boyle Model>

Figure 3:
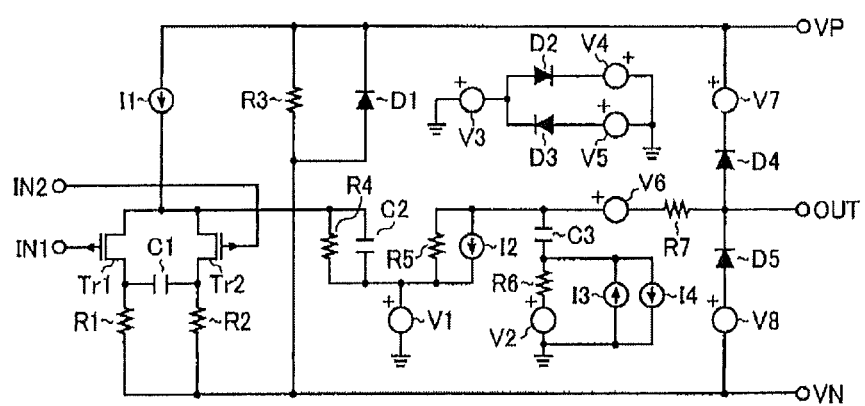
FIG. 3 is a view of a basic configuration of a macro model of an operational amplifier.

FIG. 3 is a view of a basic configuration of a macro model of an operational amplifier. The macro model according to the configuration example is referred to as a Boyle model, and the macro model of the present invention is established based on the Boyle model. In the Boyle model, except transistors Tr1 and Tr2 used as an input differential pair and diodes D1-D5 used as clamp elements, all elements are disposed to be linear elements (resistors R1-R7, capacitors C1-C3, voltage sources V1-V8 and current sources I1-I4). In addition, configuration and actions of the Boyle model are well known and thus are not further described in detail herein.

Embodiment 1

Figure 4A:
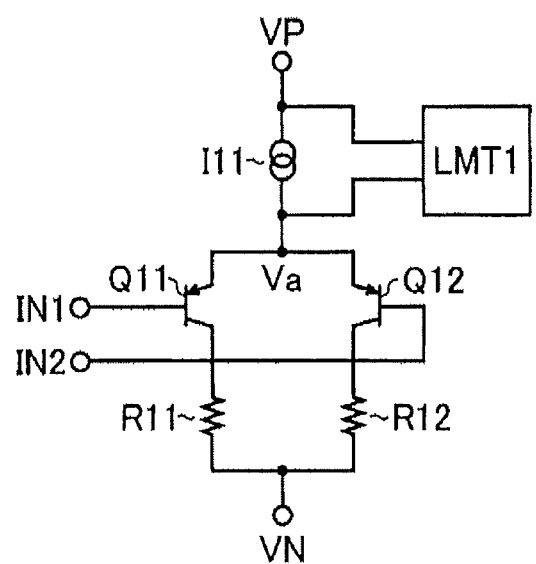
FIG. 4A illustrates Embodiment 1 (Example A) of a macro model of an operational amplifier.

FIG. 4A illustrates Embodiment 1 (Example A) of a macro model of an operational amplifier. The macro model according to Embodiment 1 (Example A) includes PNP bipolar transistors Q11 and Q12, resistors R11 and R12, a current source I11, and a voltage control portion LMT1, which serve as circuit elements for forming an input section of the operational amplifier.

A first terminal of the current source I11 is connected to a power supply terminal (an input terminal of a power supply voltage VP). A second terminal of the current source I11 is connected to emitters of the transistors Q11 and Q12. A collector of the transistor Q11 is connected to a first terminal of the resistor R11. A collector of the transistor Q12 is connected to a first terminal of the resistor R12. A base of the transistor Q11 is connected to a first input terminal (an input terminal of an input signal IN1). A base of the transistor Q12 is connected to a second input terminal (an input terminal of an input signal IN2). Second terminals of the resistors R11 and R12 are both connected to a ground terminal (an input terminal of a ground voltage VN).

The voltage control portion LMT1 limits a voltage between the two terminals of the current source I11 for generating a driving current of the input section (a difference voltage between the power supply voltage VP and an emitter voltage Va) in a specific range, and thus generates an output exception in the event of input exception or power supply exception of the operational amplifier. In addition, an upper limit or a lower limit of the determined voltage range is desirably set to be a function f (VP,T) of the power supply voltage VP and an ambient temperature T. The variation of the voltage range corresponding to the ambient temperature T can be suitably adjusted according to a circuit configuration and design specification of the operational amplifier. In addition, the ambient temperature T can refer to a value input as a basic parameter of the circuit design simulator 10.

For example, in a case where the input signal IN1 or IN2 of 3.5 V is input for the power supply voltage VP of 3 V, the emitter voltage Va of the transistors Q11 and Q12 is set to be higher than the power supply voltage VP. If such a case occurs in a actual operational amplifier, the driving current would be unable to flow from the current source I11 to the input section, and thus the emitter voltage Va would actually not be higher than the power supply voltage VP. As a result, the operational amplifier would be unable to perform correctly because the transistors Q11 and Q12 would be unable to be turned on/off correctly.

On the other hand, in a conventional macro model of the operational amplifier, even if the emitter voltage Va is a higher voltage than the power supply voltage VP, the driving current can be made to flow from the current source I11 having an ideal property to the input section, and the conventional macro model of the operational amplifier would thus perform without any problem. Therefore, it is possible that the input exception and power supply exception could be overlooked.

In this regard, in the case where the macro model has the voltage control portion LMT1 according to Embodiment 1 (Example A), the voltage (VP−Va) between the two terminals of the current source I11 is limited to a specific voltage range (VP−Va>Vth (for example, 0.2 V)). For example, even in a case where the input signal IN1 or IN2 of 3.5 V is applied for the power supply voltage VP of 3 V, the emitter voltage Va of the transistors Q11 and Q12 rises only to VP−Vth (for example, 2.8 V). As a result, although the driving current flows from the current source I11 to the input section, the transistors Q11 and Q12 cannot be correctly turned on/off, and thus the operational amplifier cannot perform correctly. The performance exception is the same as would be the case for the actual operational amplifier.

Therefore, simulation verification of an analog circuit can be performed by using the macro model according to Embodiment 1 (Example A), without omitting property evaluation and performance inspection of the analog circuit performed in the event of input exception or power supply exception, thus reducing cost and time required for trial fabrication of the analog circuit.

Figure 4B:
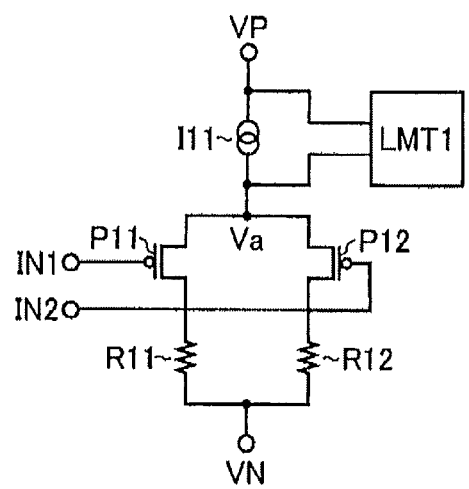
FIG. 4B illustrates Embodiment 1 (Example B) of the macro model of the operational amplifier.
Figure 4C:
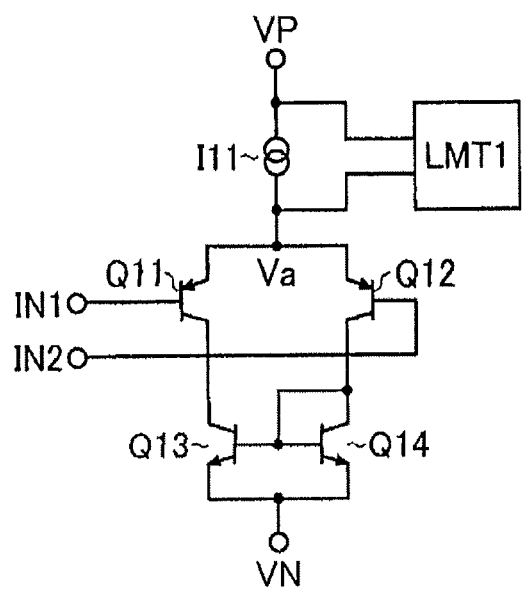
FIG. 4C illustrates Embodiment 1 (Example C) of the macro model of the operational amplifier.
Figure 4D:
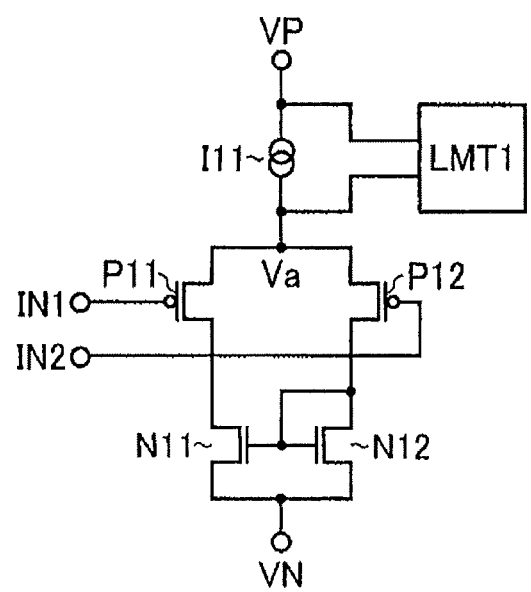
FIG. 4D illustrates Embodiment 1 (Example D) of the macro model of the operational amplifier.

In addition, the macro model according to Embodiment 1 can have various alternative configurations besides that shown in FIG. 4A. For example, as shown in FIG. 4B, the PNP bipolar transistors Q11 and Q12 can be replaced by P-channel field effect transistors P11 and P12. Moreover, as shown in FIG. 4C or FIG. 4D, active loads including the NPN bipolar transistors Q13 and Q14 (or N-channel field effect transistors N11 and N12) can also be connected in place of the resistors R11 and R12.

Embodiment 2

Figure 5A:
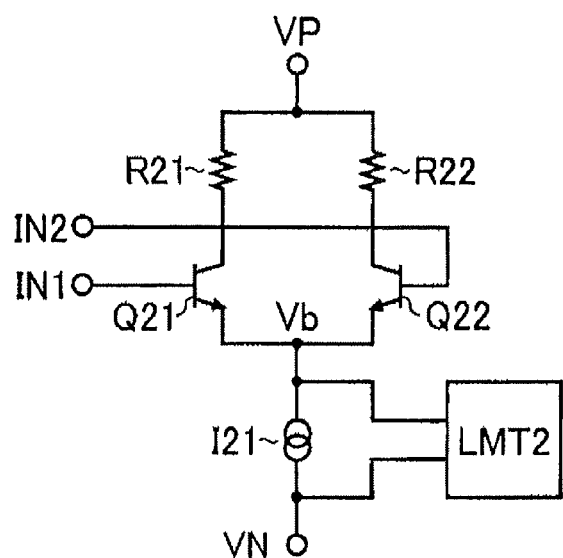
FIG. 5A illustrates Embodiment 2 (Example A) of a macro model of an operational amplifier.

FIG. 5A illustrates Embodiment 2 (Example A) of a macro model of an operational amplifier. The macro model according to Embodiment 2 (Example A) includes NPN bipolar transistors Q21 and Q22, resistors R21 and R22, a current source I21, and a voltage control portion LMT2, which serve as circuit elements for forming an input section of the operational amplifier.

A first terminal of the current source I21 is connected to a ground terminal (an input terminal of a ground voltage VN). A second terminal of the current source I21 is connected to emitters of the transistors Q21 and Q22. A collector of the transistor Q21 is connected to a first terminal of the resistor R21. A collector of the transistor Q22 is connected to a first terminal of the resistor R22. A base of the transistor Q21 is connected to a first input terminal (an input terminal of an input signal IN1). A base of the transistor Q22 is connected to a second input terminal (an input terminal of an input signal IN2). Second terminals of the resistors R21 and R22 are both connected to a power supply terminal (an input terminal of a power supply voltage VP).

The voltage control portion LMT2 generates an output exception in the event of input exception or power supply exception of the operational amplifier by limiting a voltage between the two terminals of the current source I21 for generating a driving current of the input section (a difference voltage between an emitter voltage Vb and the ground voltage VN) in a specific range. In addition, an upper limit or a lower limit of the determined voltage range is desirably set to be a function f (VN,T) of the ground voltage VN and an ambient temperature T. The variation of the voltage range corresponding to the ambient temperature T can be suitably adjusted according to a circuit configuration and design specification of the operational amplifier. In addition, the ambient temperature T can refer to a value input as a basic parameter of the circuit design simulator 10.

For example, in the case where the input signal IN1 or IN2 of −0.5 V is input for the ground voltage VN of 0 V, the emitter voltage Vb of the transistors Q11 and Q12 is lower than the ground voltage VN. If such a case occurs in a actual operational amplifier, the driving current cannot flow from the current source I21 to the input section, and thus the emitter voltage Vb is actually not lower than the ground voltage VN. As a result, the operational amplifier cannot perform correctly because the transistors Q21 and Q22 cannot be turned on/off correctly.

On the other hand, in a conventional macro model of the operational amplifier, even if the emitter voltage Vb is a low voltage less than the ground voltage VN, the driving current can also be made to flow from the current source I21 having an ideal property to the input section, such that the conventional macro model of the operational amplifier performs without any problem. Therefore, it is possible that the input exception and power supply exception could be overlooked.

In this regard, in a case where the macro model has the voltage control portion LMT2 according to Embodiment 2 (Example A), the voltage (Vb−VN) between the two terminals of the current source I21 is limited to a specific voltage range (Vb−VN>Vth (for example, 0.2 V)). For example, even in a case where the input signal IN1 or IN2 of −0.5 V is applied for the ground voltage VN of 0 V, the emitter voltage Vb of the transistors Q21 and Q22 drops only to VN+Vth (for example, 0.2 V). As a result, although the driving current flows from the current source I21 to the input section, the transistors Q21 and Q22 cannot be correctly turned on/off, and thus the operational amplifier cannot perform correctly. The performance exception is the same would be the case for the actual operational amplifier.

Therefore, simulation verification of an analog circuit can be performed by using the macro model according to Embodiment 2 (Example A), without omitting property evaluation and performance inspection of the analog circuit performed in the event of input exception or power supply exception, thus reducing cost and time required for trial fabrication of the analog circuit.

Figure 5B:
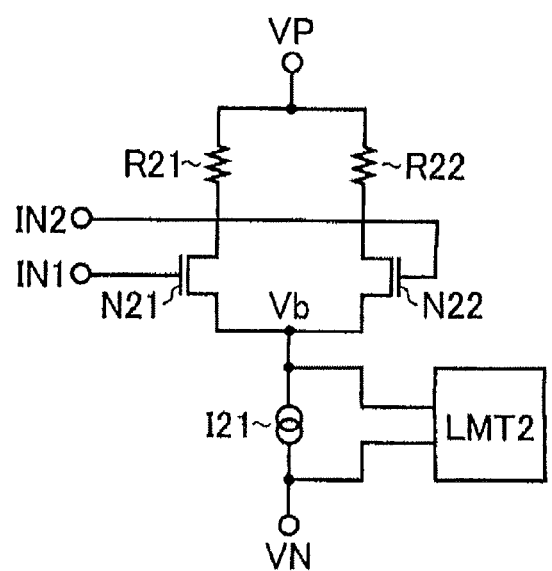
FIG. 5B illustrates Embodiment 2 (Example B) of the macro model of the operational amplifier.
Figure 5C:
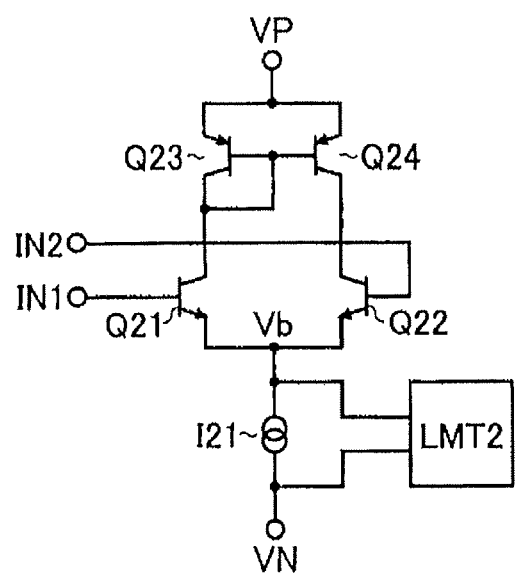
FIG. 5C illustrates Embodiment 2 (Example C) of the macro model of the operational amplifier.
Figure 5D:
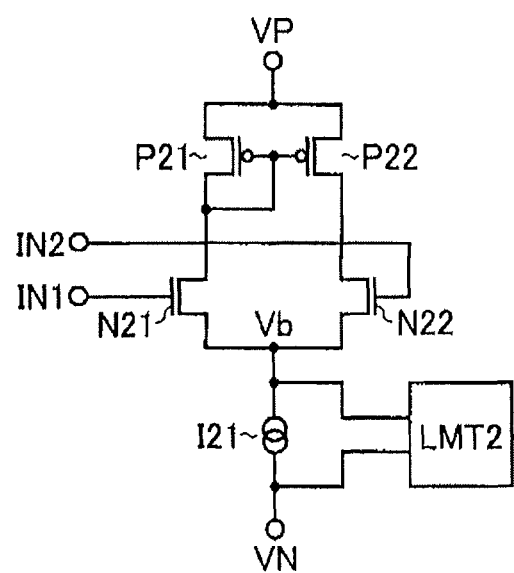
FIG. 5D illustrates Embodiment 2 (Example D) of the macro model of the operational amplifier.

In addition, the macro model according to Embodiment 2 can have various alternative configurations besides that shown in FIG. 5A. For example, as shown in FIG. 5B, the NPN bipolar transistors Q21 and Q22 can be replaced by N-channel field effect transistors N21 and N22. Moreover, as shown in FIG. 5C or FIG. 5D, active loads including the PNP bipolar transistors Q23 and Q24 (or P-channel field effect transistors P21 and P22) can also be connected in place of the resistors R21 and R22.

Embodiment 3

Figure 6A:
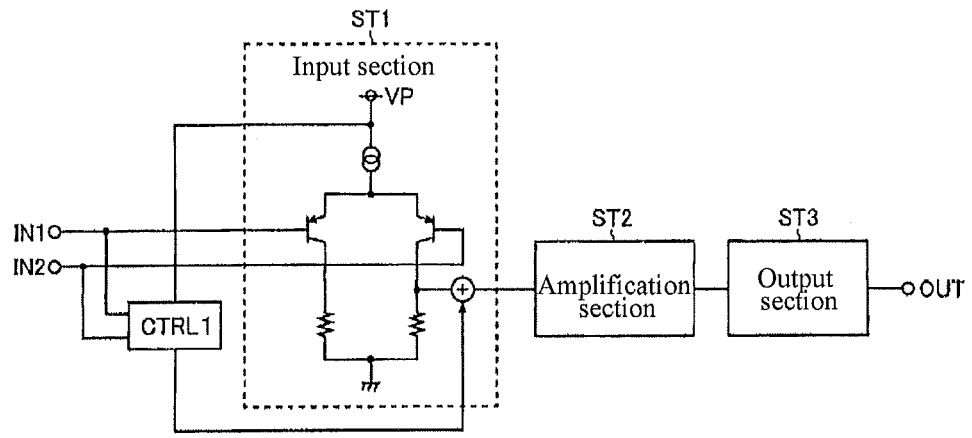
FIG. 6A illustrates Embodiment 3 (Example A) of a macro model of an operational amplifier.

FIG. 6A illustrates Embodiment 3 (Example A) of a macro model of an operational amplifier. The macro model according to Embodiment 3 (Example A) has an output control portion CTRL1, in addition to an input section ST1, an amplification section ST2 and an output section ST3. Furthermore, in the macro model according to Embodiment 3, the input section ST1 includes an input differential pair having two PNP bipolar transistors.

The output control portion CTRL1 monitors input signals IN1 and IN2 and a power supply voltage VP if an exception determination is found, and controls the input section ST1 of the operational amplifier to generate an output exception in the event of input exception or power supply exception of the operational amplifier.

For example, in a case where the input signal IN1 or IN2 of 3.5 V is input for the power supply voltage VP of 3 V, it is determined that the output control portion CTRL1 generates the input exception or the power supply exception, and an output function of the input section ST1 is controlled in a way such that an output signal OUT of the operational amplifier becomes an exceptional value (for example, zero).

In addition, the output control portion CTRL1 desirably further monitors the ambient temperature T if an exception determination is found. The variation of an exception determination criterion corresponding to the ambient temperature T can be suitably adjusted according to a circuit configuration and design specification of the operational amplifier. In addition, the ambient temperature T can refer to a value input as a basic parameter of the circuit design simulator 10.

Figure 6B:
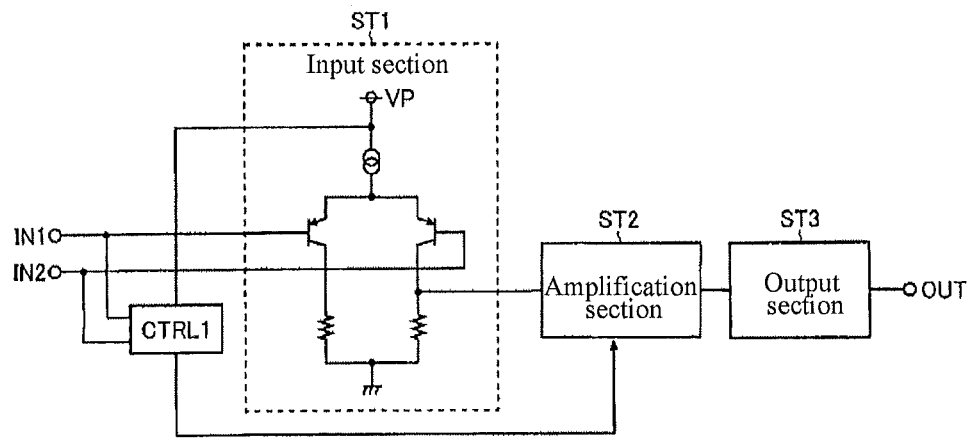
FIG. 6B illustrates Embodiment 3 (Example B) of the macro model of the operational amplifier.
Figure 6C:
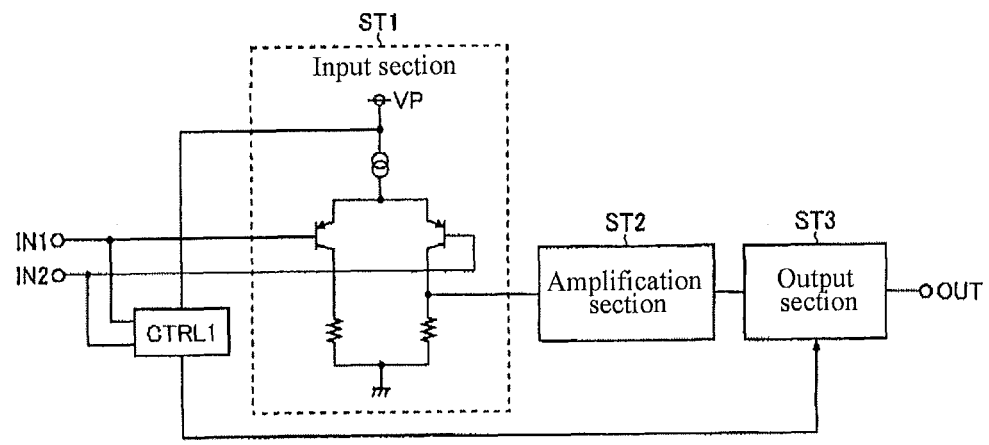
FIG. 6C illustrates Embodiment 3 (Example C) of the macro model of the operational amplifier.

In addition, the macro model according to Embodiment 3 can have various alternative configurations besides that shown in FIG. 6A. For example, as shown in FIG. 6B or FIG. 6C, a configuration can be designed in which instead of the output control of the input section ST1, the output control of the amplification section ST2 and the output section ST3 can be performed. In addition, although not shown, the PNP bipolar transistors forming the input differential pair can be optionally replaced by P-channel field effect transistors, or loads connected to the input differential pair can be changed from passive elements to active elements.

Embodiment 4

Figure 7A:
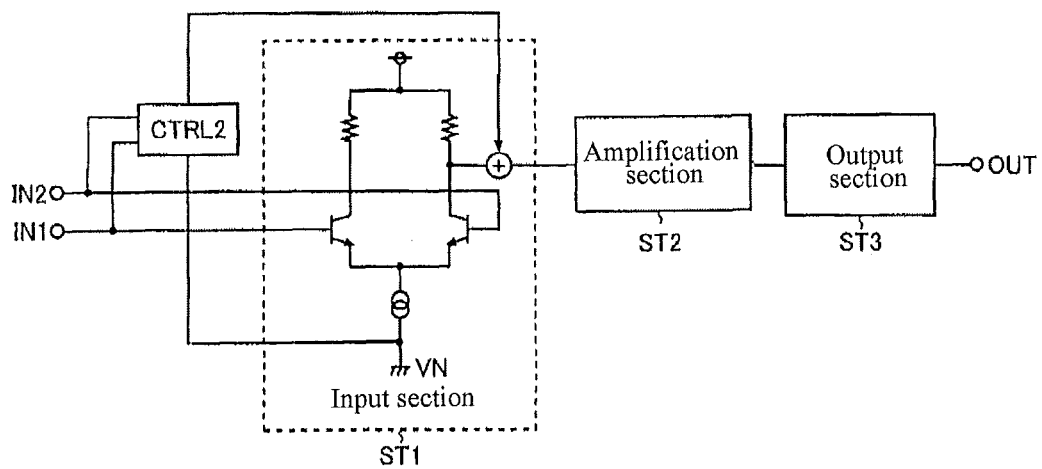
FIG. 7A illustrates Embodiment 4 (Example A) of a macro model of an operational amplifier.

FIG. 7A illustrates Embodiment 4 (Example A) of a macro model of an operational amplifier. The macro model according to Embodiment 4 (Example A) has an output control portion CTRL2, in addition to an input section ST1, an amplification section ST2 and an output section ST3. Furthermore, in the macro model according to Embodiment 4, the input section ST1 includes an input differential pair having two NPN bipolar transistors.

The output control portion CTRL2 monitors input signals IN1 and IN2 and a ground voltage VN if an exception determination is found, and controls the input section ST1 of the operational amplifier to generate an output exception in the event of input exception or power supply exception of the operational amplifier.

For example, in a case where the input signal IN1 or IN2 of −0.5 V is input for the ground voltage VN of 0 V, it is determined that the output control portion CTRL2 generates an input exception or power supply exception, and an output function of the input section ST1 is controlled in a way such that an output signal OUT of the operational amplifier becomes an exceptional value (for example, zero).

In addition, the output control portion CTRL2 desirably further monitors the ambient temperature T if an exception determination is found. The variation of an exception determination criterion corresponding to the ambient temperature T can be suitably adjusted according to a circuit configuration and design specification of the operational amplifier. In addition, the ambient temperature T can refer to a value input as a basic parameter of the circuit design simulator 10.

Figure 7B:
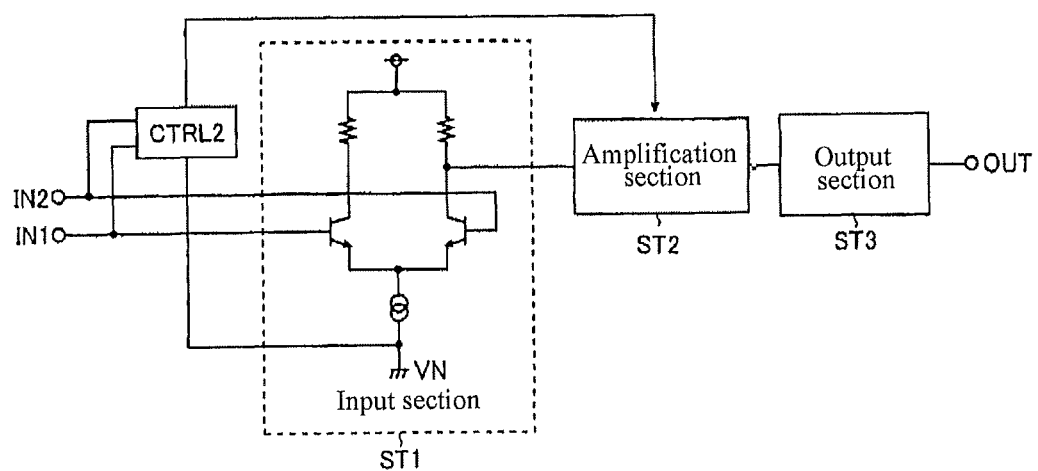
FIG. 7B illustrates Embodiment 4 (Example B) of the macro model of the operational amplifier.
Figure 7C:
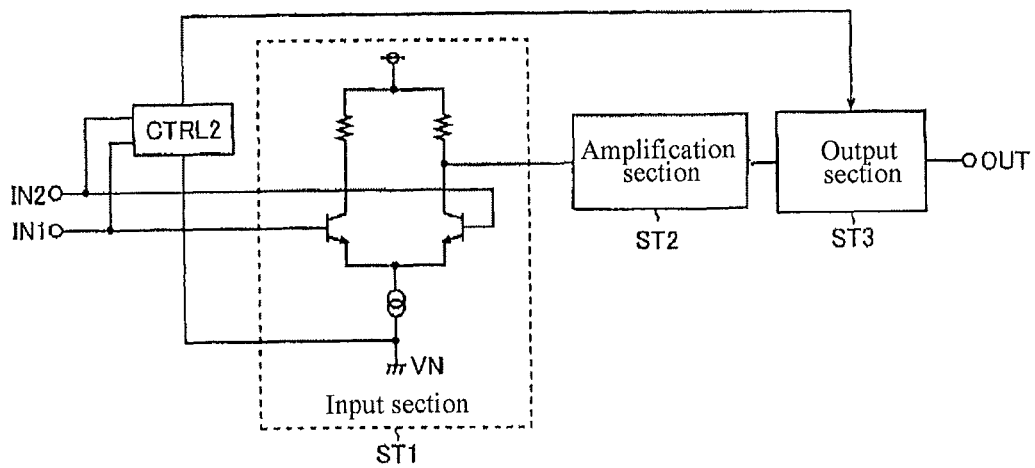
FIG. 7C illustrates Embodiment 4 (Example C) of the macro model of the operational amplifier.

In addition, the macro model according to Embodiment 4 can have various alternative configurations besides that shown in FIG. 7A. For example, as shown in FIG. 7B or FIG. 7C, a configuration can be designed in which instead of the output control of the input section ST1, the output control of the amplification section ST2 and the output section ST3 can be performed. In addition, although not shown, the NPN bipolar transistors forming the input differential pair can be optionally replaced by N-channel field effect transistors, or loads connected to the input differential pair can be changed from passive elements to active elements.

Embodiment 5

Figure 8:
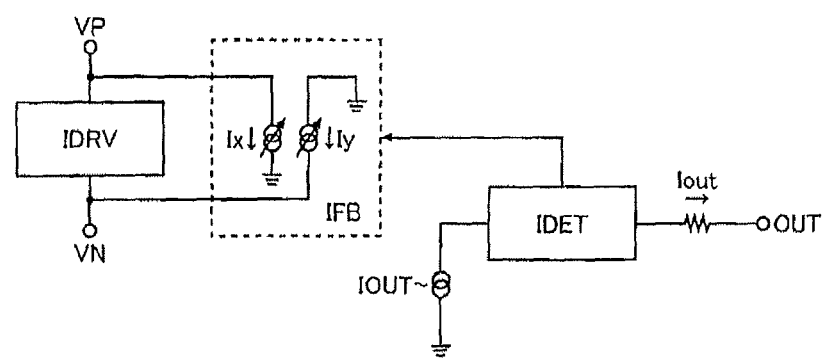
FIG. 8 illustrates Embodiment 5 of a macro model of an operational amplifier.

FIG. 8 illustrates Embodiment 5 of a macro model of an operational amplifier. The macro model according to Embodiment 5 includes a driving current generation portion IDRV, an output current generation portion IOUT, an output current detection portion IDET, and a feedback current generation portion IFB.

The driving current generation portion IDRV is located between a power supply terminal VP and a ground terminal VN, and generates a driving current Idrv of the operational amplifier. A value of the driving current Idrv is determined by a power supply voltage applied to the power supply terminal VP and a ground voltage applied to the ground terminal VN.

The output current generation portion IOUT is located between an output terminal OUT and an ideal ground, and generates an output current IOUT of the operational amplifier.

The output current detection portion IDET detects a magnitude and a direction of the output current IOUT. In a SPICE based simulation program for circuit design, a voltage source with an electromotive force of 0 V can be used as the output current detection portion IDET.

The feedback current generation portion IFB is located between the power supply terminal VP and the ideal ground or between the ideal ground and the ground terminal VN, and generates a feedback current Ix, Iy corresponding to the output current Iout. Specifically, the feedback current generation portion IFB generates a feedback current Ix flowing from the power supply terminal VP to the ideal ground when the output current Iout flows from the ideal ground to the output terminal OUT, and generates a feedback current Iy flowing from the ideal ground to the ground terminal VN when the output current Iout flows from the output terminal OUT to the ideal ground.

In addition, when the operational amplifier is at a level A or a level B, any one of the feedback currents Ix and Iy is required to enable all the output current Iout to flow. On the other hand, when the operational amplifier is at a level A or higher, the feedback current Ix is required to enable a part of the output current Iout to flow, and the feedback current Iy is required to enable all the output current Iout to flow.

In this way, in the macro model according to Embodiment 5, the feedback current Ix, Iy can be made to flow to the power supply terminal VP or the ground terminal VN according to the output current Iout flowing to the output terminal OUT of the operational amplifier. Therefore, in the macro model according to Embodiment 5, the driving current Idrv and the output current Iout of the operational amplifier can be matched, and thus simulation verification can be performed on drop of power supply voltage or rise of ground voltage caused by resistance of substrate wiring. This configuration is most desirably employed when the operational amplifier has a high gain.

Combination of Embodiments

In the above descriptions, Embodiments 1-4 relating to the input section, the amplification section and the output section and Embodiment 5 relating to the driving current generation portion and the output current generation portion in various constitutional elements contained in the macro model of the operational amplifier are described separately; however, any one of Embodiments 1-4 can be optionally combined with Embodiment 5. Through such a configuration, although the load in analog operation increases somewhat, the simulation will be closer to a response of a actual machine.

Other Variant Examples

While several embodiments of the present invention have been illustrated and described, various modifications and improvements can be made by those skilled in the art. The embodiments of the present invention are therefore described in an illustrative but not in a restrictive sense. It is intended that the present invention should not be limited to the particular forms as illustrated and that all modifications which maintain the spirit and scope of the present invention are within the scope defined in the appended claims.

INDUSTRIAL APPLICABILITY

The present invention is preferably used in the field of Computer Aided Engineering (CAE), circuit design, and modeling.

What is claimed is:

1. A computer executing a program, being a component of a simulation program for circuit design, the computer comprising an operation portion, a storage portion, a manipulation portion, and a display portion so that the computer functions as a circuit design simulator, and as a macro model of an operational amplifier for use in the circuit design simulator, enabling the computer to act by simulating a response of the operational amplifier on the circuit design simulator, wherein the macro model of the operational amplifier comprises:
    a control portion for generating an output exception in the event of input exception or power supply exception of the operational amplifier; and
    a feedback current generation portion,
    wherein the feedback current generation portion generates a feedback current flowing from a power supply terminal to an ideal ground when an output current flows from the ideal ground to an output terminal, and generates a feedback current flowing from the ideal ground to a ground terminal when the output current flows from the output terminal to the ideal ground.

2. The computer according to claim 1, wherein the control portion limits a voltage between two terminals of a current source for generating a driving current of an input section in a specific range.

3. The computer according to claim 2, wherein an upper limit is set to be a function of a power supply voltage and an ambient temperature.

4. The computer according to claim 1, wherein the control portion monitors an input signal and the power supply voltage if an exception determination is found, and controls at least one of the input section, an amplification section, and an output section of the operational amplifier and generates output exception in the event of input exception or power supply exception of the operational amplifier.

5. The computer according to claim 4, wherein the control portion further monitors the ambient temperature if an exception determination is found.

6. The computer according to claim 5, wherein the macro model of the operational amplifier further comprises:
    a driving current generation portion, located between the power supply terminal and the ground terminal, for generating a driving current of the operational amplifier;
    an output current generation portion, located between the output terminal and the ideal ground, for generating the output current of the operational amplifier;
    an output current detection portion, for detecting a magnitude and a direction of the output current; and
    a feedback current generation portion, located between the power supply terminal and the ideal ground or between the ideal ground and the ground terminal, for generating the feedback current corresponding to the output current.

7. A computer executing a program, being a component of a simulation program for circuit design, the computer comprising an operation portion, a storage portion, a manipulation portion, and a display portion so that the computer exerts a function of a circuit design simulator, and as a macro model of an operational amplifier for use in the circuit design simulator, enabling the computer to act by simulating an action of the operational amplifier on the circuit design simulator, wherein the macro model of the operational amplifier comprises:
    a driving current generation portion, located between a power supply terminal and a ground terminal, for generating a driving current of the operational amplifier;
    an output current generation portion, located between an output terminal and an ideal ground, for generating an output current of the operational amplifier;
    an output current detection portion, for detecting a magnitude and a direction of the output current; and
    a feedback current generation portion, located between the power supply terminal and the ideal ground or between the ideal ground and the ground terminal, for generating a feedback current corresponding to the output current, wherein the feedback current generation portion generates a feedback current flowing from the power supply terminal to the ideal ground when the output current flows from the ideal ground to the output terminal, and generates a feedback current flowing from the ideal ground to the ground terminal when the output current flows from the output terminal to the ideal ground.

8. A computer executing a simulation program for circuit design, the computer comprising an operation portion, a storage portion, a manipulation portion, and a display portion so that the computer functions as a circuit design simulator, the simulation program comprising:
    a main program; and
    a model library referenced by the main program;
    wherein the model library comprises the program according to claim 7 as a macro model of an operational amplifier for use in the circuit design simulator.

9. The computer according to claim 8, wherein the main program comprises:
    a circuit fabrication module, enabling the operation portion and the display portion to function, so as to fabricate a circuit on the circuit design simulator according to an input from the manipulation portion;
    a component reference module, enabling the operation portion and the display portion to function, so as to refer to the model library according to an input from the manipulation portion;
    a probe disposition module, enabling the operation portion and the display portion to function, so as to dispose a probe on the circuit according to an input from the manipulation portion;
    a waveform plotting module, enabling the operation portion and the display portion to function, so as to plot a waveform of a node disposed with the probe according to an input from the manipulation portion; and
    a waveform analysis module, enabling the operation portion and the display portion to function, so as to analysis the waveform according to an input from the manipulation portion.

10. A computer executing a simulation program for circuit design, wherein the simulation program comprises a macro model of an operational amplifier having a control portion for generating output exception in the event of input exception or power supply exception and a feedback current generation portion, wherein the feedback current generation portion generates a feedback current flowing from a power supply terminal to an ideal ground when an output current flows from the ideal ground to an output terminal, and generates a feedback current flowing from the ideal ground to a ground terminal when the output current flows from the output terminal to the ideal ground.

11. The computer according to claim 10, wherein the control portion limits a voltage between two terminals of a current source for generating a driving current of an input section in a specific range.

12. The computer according to claim 11, wherein an upper limit is set to be a function of power supply voltage and ambient temperature.

13. The computer according to claim 10, wherein the control portion monitors an input signal and the power supply voltage if an exception determination is found, and controls at least one of the input section, an amplification section, and an output section of the operational amplifier and generates output exception in the event of input exception or power supply exception of the operational amplifier.

14. The computer according to claim 13, wherein the control portion further monitors the ambient temperature if an exception determination is found.

15. The computer according to claim 14, wherein the macro model of the operation amplifier further comprises:
    a driving current generation portion, located between the power supply terminal and the ground terminal, for generating a driving current of the operational amplifier;
    an output current generation portion, located between the output terminal and the ideal ground, for generating the output current of the operational amplifier;
    an output current detection portion, for detecting a magnitude and a direction of the output current; and
    a feedback current generation portion, located between the power supply terminal and the ideal ground or between the ideal ground and the ground terminal, for generating the feedback current corresponding to the output current.

16. A computer executing a simulation program for circuit design, wherein the simulation program comprises a macro model of an operational amplifier, wherein the macro model of the operational amplifier comprises:
    a driving current generation portion, located between a power supply terminal and a ground terminal, for generating a driving current of the operational amplifier;
    an output current generation portion, located between an output terminal and an ideal ground, for generating an output current of the operational amplifier;
    an output current detection portion, for detecting a magnitude and a direction of the output current; and
    a feedback current generation portion, located between the power supply terminal and the ideal ground or between the ideal ground and the ground terminal, for generating a feedback current corresponding to the output current, wherein the feedback current generation portion generates a feedback current flowing from the power supply terminal to the ideal ground when the output current flows from the ideal ground to the output terminal, and generates a feedback current flowing from the ideal ground to the ground terminal when the output current flows from the output terminal to the ideal ground.

* * * * *